US011627689B2

(12) United States Patent
Sun et al.

(10) Patent No.: US 11,627,689 B2
(45) Date of Patent: Apr. 11, 2023

(54) METHOD AND STRUCTURE FOR ENCAPSULATING THIN FILMS, DISPLAY DEVICE

(71) Applicant: BOE TECHNOLOGY GROUP CO., LTD., Beijing (CN)

(72) Inventors: Tao Sun, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 388 days.

(21) Appl. No.: 16/474,718

(22) PCT Filed: Feb. 26, 2019

(86) PCT No.: PCT/CN2019/076152
§ 371 (c)(1),
(2) Date: Jun. 28, 2019

(87) PCT Pub. No.: WO2019/184641
PCT Pub. Date: Oct. 3, 2019

(65) Prior Publication Data
US 2021/0336204 A1   Oct. 28, 2021

(30) Foreign Application Priority Data
Mar. 29, 2018   (CN) .......................... 201810272554.5

(51) Int. Cl.
*H01L 51/56*   (2006.01)
(52) U.S. Cl.
CPC ........... *H10K 50/844* (2023.02); *H10K 71/00* (2023.02); *H10K 2102/102* (2023.02); *H10K 2102/103* (2023.02)

(58) Field of Classification Search
CPC ... H01L 51/5253; H01L 51/56; H01L 51/306; H01L 51/308; H01L 21/6719;
(Continued)

(56) References Cited

U.S. PATENT DOCUMENTS

2003/0207500 A1* 11/2003 Pichler ................ H01L 51/5253
438/127
2005/0248270 A1* 11/2005 Ghosh ................. H01L 51/5259
313/512

(Continued)

FOREIGN PATENT DOCUMENTS

CN      105514298 A     4/2016
CN      103794734 B     10/2017
(Continued)

OTHER PUBLICATIONS

Indian First Examination Report dated Nov. 6, 2020 corresponding to application No. 201927037612.
(Continued)

*Primary Examiner* — Caridad Everhart
(74) *Attorney, Agent, or Firm* — Nath, Goldberg & Meyer; Joshua B. Goldberg

(57) ABSTRACT

A thin film encapsulation structure includes a first barrier layer encapsulating a to-be-encapsulated structure on a substrate; an organic layer on the first barrier layer; a second barrier layer encapsulating the organic layer; a masking layer on the second barrier layer, orthographic projections of the second barrier layer, the first barrier layer and the masking layer on the substrate substantially overlap with each other, and a material of the masking layer has a smaller etching rate than a material of the second barrier layer.

10 Claims, 7 Drawing Sheets

(58) Field of Classification Search
CPC ........... H01L 27/322; H01L 2251/5315; H01L 2251/307; H01L 2251/308; C23C 16/22; C23C 16/04; C23C 16/54; C23C 16/52; C23C 16/042

See application file for complete search history.

(56) References Cited

U.S. PATENT DOCUMENTS

| | | | |
|---|---|---|---|
| 2009/0242127 A1* | 10/2009 | Koshimizu | H01J 37/32642 156/345.28 |
| 2012/0223418 A1* | 9/2012 | Stowers | C23C 18/1216 257/632 |
| 2015/0287959 A1 | 10/2015 | Hanamura | |
| 2016/0079565 A1 | 3/2016 | Maindron et al. | |
| 2016/0306472 A1* | 10/2016 | Park | H01L 51/5256 |
| 2017/0271618 A1 | 9/2017 | Kamiya | |
| 2018/0269427 A1* | 9/2018 | Park | H01L 51/5246 |

FOREIGN PATENT DOCUMENTS

| | | |
|---|---|---|
| JP | 2015207551 A | 11/2015 |
| JP | 2017168411 A | 9/2017 |

OTHER PUBLICATIONS

First Office Action dated Aug. 31, 2020, for corresponding Korean application 10-2019-7018831.

Second Office Action dated Aug. 11, 2020, for corresponding Chinese application 201810272554.5.

First Office Action dated Feb. 6, 2020 corresponding to Chinese application No. 201810272554.5.

International Search Report dated Apr. 3, 2019 corresponding to application No. PCT/CN2019/076152.

Extended European Search Report dated Feb. 4, 2022 corresponding to application No. 19731864.5-1211.

* cited by examiner

METHOD AND STRUCTURE FOR ENCAPSULATING THIN FILMS, DISPLAY DEVICE

This is a National Phase Application filed under 35 U.S.C. 371 as a national stage of PCT/CN2019/076152, filed Feb. 26, 2018, an application claiming the benefit of Chinese Patent Application No. 201810272554.5, filed on Mar. 29, 2018, entitled "METHOD AND STRUCTURE FOR ENCAPSULATING THIN FILMS, DISPLAY DEVICE", the content of each of which is hereby incorporated by reference in its entirety.

CROSS-REFERENCE TO RELATED APPLICATION

The present application claims the priority to the Chinese Patent Application No. 201810272554.5, filed on Mar. 29, 2018, entitled "METHOD AND STRUCTURE FOR ENCAPSULATING THIN FILMS, DISPLAY DEVICE", the disclosure of which is incorporated by reference herein in its entirety.

TECHNICAL FIELD

The present disclosure relates to the field of thin film encapsulation technology, and in particular, to a method for encapsulating thin films, a thin film encapsulation structure, and a display device.

BACKGROUND

An organic light-emitting diode (OLED) has been widely applied in various fields such as lighting and display due to the advantages of being light and thin, transparent, surface-emitting, self-illuminating, flexible and bendable. A method for fabricating a flexible OLED device differs from a process for fabricating a conventional OLED device in that a process for fabricating a flexible substrate is added and an encapsulating process is changed. A thin film encapsulation method is generally employed for encapsulating a flexible OLED device. With the increasing demand of consumers and the upgrading of products, the demand for flexible OLED with narrow bezels is growing. It is required to develop an encapsulation technology for achieving narrow bezel so as to meet the market needs. The conventional thin film encapsulation technology employs a mask plate to pattern the encapsulated thin films by vacuum coating.

SUMMARY

The present disclosure provides a thin film encapsulation structure, including: a first barrier layer encapsulating a to-be-encapsulated object on a substrate; an organic layer on a side of the first barrier layer distal to the substrate, an orthographic projection of the to-be-encapsulated object on the substrate being within an orthographic projection of the organic layer on the substrate; a second barrier layer encapsulating the organic layer; and a masking layer on a side of the second barrier layer distal to the substrate, orthographic projections of the masking layer, the second barrier layer and the first barrier layer on the substrate substantially overlap with each other, and a material of the masking layer has a smaller etching rate than a material of the second barrier layer.

For example, in a thin film encapsulation structure according to at least one embodiment of the present disclosure, the material of the masking layer includes a metal oxide.

For example, in a thin film encapsulation structure according to at least one embodiment of the present disclosure, the material of the masking layer includes at least one of aluminum oxide, zinc oxide, indium oxide, tin oxide, gallium oxide, hafnium oxide, zirconium oxide, and/or, the material of the first barrier layer includes at least one of silicon nitride, silicon oxide, silicon oxynitride, and/or, the material of the second barrier layer includes at least one of silicon nitride, silicon oxide, silicon oxynitride.

For example, in a thin film encapsulation structure according to at least one embodiment of the present disclosure, the masking layer has a smaller thickness than the second barrier layer.

For example, in a thin film encapsulation structure according to at least one embodiment of the present disclosure, the masking layer has a thickness of no greater than 100 nm, and the first barrier layer or the second barrier layer has a thickness in the range of about 0.1 to 1 μm.

For example, in a thin film encapsulation structure according to at least one embodiment of the present disclosure, a sidewall of the second barrier layer attached to a side surface of the organic layer has a thickness of no smaller than a thickness of a proportion of the second barrier layer between the masking layer and the organic layer.

For example, in a thin film encapsulation structure according to at least one embodiment of the present disclosure, the orthographic projection of the organic layer on the substrate falls within the orthographic projection of the first barrier layer on the substrate.

For example, in a thin film encapsulation structure according to at least one embodiment of the present disclosure, the orthographic projection of the first barrier layer on the substrate falls within the orthographic projection of the organic layer on the substrate.

For example, in a thin film encapsulation structure according to at least one embodiment of the present disclosure, a material of the organic layer includes a resin organic material.

The present disclosure provides a method for encapsulating thin films in at least one embodiment. The method includes: providing a substrate, the substrate comprising at least one functional region provided with a to-be-encapsulated object; forming a first barrier material layer encapsulating the to-be-encapsulated object; forming an organic layer such that an orthographic projection of the organic layer on the substrate is within the functional region, and an orthographic projection of the to-be-encapsulated object on the substrate is within an orthographic projection of the organic layer on the substrate; forming a second barrier material layer encapsulating the organic layer; forming a masking material layer on a proportion of the second barrier material layer such that an orthographic projection of the masking material on the substrate is within the functional region and within an orthographic projection of the second barrier material layer on the substrate, the orthographic projection of the organic layer on the substrate is within the orthographic projection of the masking material layer on the substrate, and the masking material layer has a smaller thickness than the second barrier material layer; and the performing an etching process on the second barrier material layer by using the masking material layer as a mask, such that the masking material layer is etched simultaneously, and a second barrier layer and a masking layer are formed, in which the masking material layer has a smaller etching rate than the second barrier material layer.

For example, in a method for encapsulating a thin film according to at least one embodiment of the present disclosure, forming the organic layer such that an orthographic projection of the organic layer on the substrate is within the functional region includes forming the organic layer such that the orthographic projection of the organic layer on the substrate is within an orthographic projection of the first barrier material layer on the substrate; the thin film encapsulation method further includes performing an etching process on the first barrier material layer, in which the masking material layer has a smaller etching rate than the first barrier material layer.

For example, in a method for encapsulating a thin film according to at least one embodiment of the present disclosure, the step of forming the organic layer such that an orthographic projection of the organic layer on the substrate is within the functional region includes forming the organic layer such that an orthographic projection of the first barrier material layer on the substrate is within the orthographic projection of the organic layer on the substrate.

For example, in a method for encapsulating a thin film according to at least one embodiment of the present disclosure, the first barrier material layer or the second barrier material layer has an eight times greater etching rate of than the masking material layer, and the masking material layer has a thickness of no smaller than one eighth of a sum of thicknesses of the first barrier material layer and the second barrier material layer.

For example, in a method for encapsulating a thin film according to at least one embodiment of the present disclosure, after completing the etching on the first barrier material layer, the second barrier material layer and the masking material layer, a masking layer has a remaining thickness of no greater than 100 nm.

For example, in a method for encapsulating a thin film according to at least one embodiment of the present disclosure, forming the masking material layer in which the orthographic projection of the masking material layer on the substrate outside the orthographic projection of the organic layer on the substrate is an annular region, and a width of the annular region is greater than the thickness of the second barrier material layer.

For example, in a method for encapsulating a thin film according to at least one embodiment of the present disclosure, the masking material layer is formed by atomic layer deposition with a mask plate.

For example, in a method for encapsulating a thin film according to at least one embodiment of the present disclosure, a process of plasma enhanced chemical vapor deposition is employed in the process of forming the first barrier material layer and the second barrier material layer, and the first barrier material layer or the second harrier material layer has a thickness of about 0.1 to 1 μm.

For example, in a method for encapsulating a thin film according to at least one embodiment of the present disclosure, an inductively coupled plasma process is employed in the process of performing an etching process on the first barrier material layer and the second barrier material layer.

For example, in a method for encapsulating a thin film according to at least one embodiment of the present disclosure, an opening of the mask plate in a mask plate frame is disposed to expose the entire substrate in the process of plasma enhanced chemical vapor deposition when forming the first barrier material layer and/or the second harrier material layer.

The present disclosure provides a display device in at least one embodiment, including the thin film encapsulation structure described above or a thin film encapsulation structure formed by the thin film encapsulation method described above, in which the to-be-encapsulated object or encapsulated object includes a light-emitting structure and a control circuit.

BRIEF DESCRIPTION OF THE DRAWINGS

In order to illustrate technical solutions of embodiments of the present disclosure more clearly, accompanying drawings illustrating the embodiments will be briefly described below. It is obvious that the drawings in the following description relate only to some embodiments of the present disclosure, and are not intended to limit the disclosure.

FIG. 5A-5G are schematic diagrams illustrating to-be-encapsulated structures formed in each step of a flowchart illustrating a method for encapsulating thin films according to an embodiment of the present disclosure, in which FIG. 5G is a top view of the masking layer and the organic layer in FIG. 5F;

DETAILED DESCRIPTION

The technical solutions of embodiments of the present disclosure will be described below clearly and completely with reference to accompanying drawings of the embodiments of the present disclosure in order to make the objectives, technical solutions and advantages of the embodiments of the present disclosure clearer. Evidently, the described embodiments are part of the embodiments of the present disclosure, and not all of the embodiments. All other embodiments Obtained by a person of ordinary skill in the art based on the described embodiments of the present disclosure on the premise of not exercising an inventive labor are within the scope of the present disclosure.

Unless otherwise defined, technical terms or scientific terms used in the present disclosure are intended to be understood in an ordinary meaning by one having the ordinary skill in the art. The word "first," "second," or similar word used in the present disclosure does not denote any order, quantity, or importance, but are only used to distinguish different components. The word "comprise", "include" or the like means that the element or item prior to the word is intended to cover the element or item after the word or their equivalents without excluding other elements or items. The words "connect", "couple" and the like are not limited to physical or mechanical connections, but may include electrical connections regardless of direct or indirect electrical connection. The words "on", "below", "left", "right", etc. are only used to indicate the relative positional relationship, and when absolute positions of objects to be described are changed, the relative positional relationship may also change accordingly. The term "encapsulate" used in this disclosure refers to covering all exposed surfaces of the to-be-encapsulated object, rather than merely covering its largest surface.

When a flexible OLED device is encapsulated by means of vacuum coating, there is a gap between a mask plate and a substrate for forming a film, and inevitably there is a shadow phenomenon, that is, the formed film extends to the vicinity the edge of an opening of the mask plate below the mask plate and the range of the bezel is extended, which is not conducive to achieve a narrow bezel.

Figure 1:
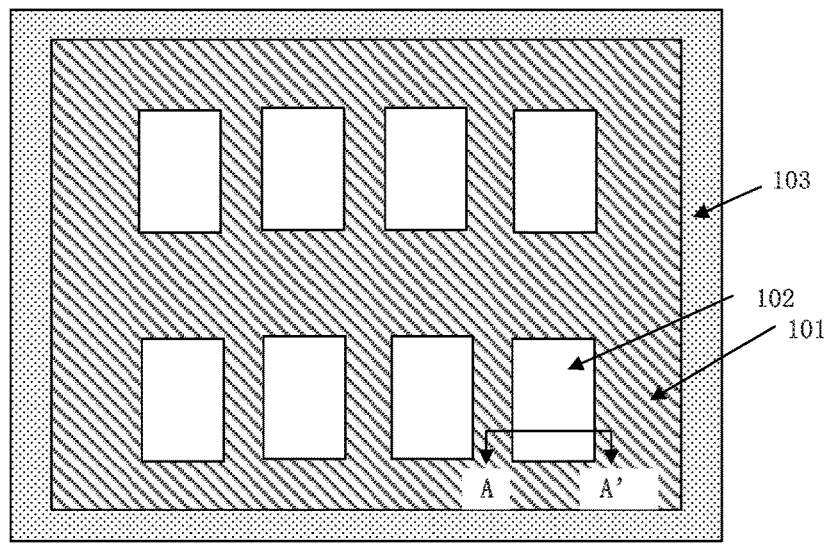
FIG. 1 is a schematic diagram of a PECVD mask used for forming a barrier layer in a thin film encapsulation technology in the related art.
Figure 2:
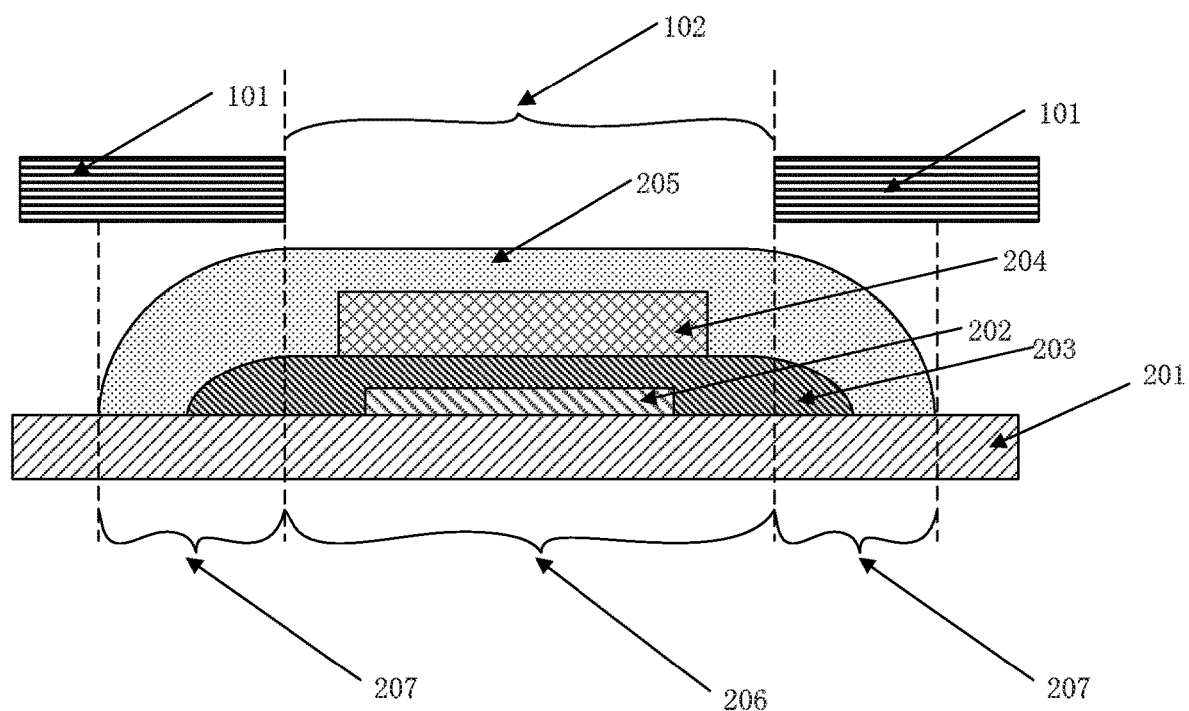
FIG. 2 is a side view of the PECVD mask in FIG. 1 taken along the A-A' direction and also a side view of the barrier layer formed using the PECVD mask and a schematic diagram illustrating a thin film encapsulation structure.

As described above, in the process of encapsulating thin films of an OLED, a encapsulated film therein is usually patterned by a masking process. For example, FIG. 1 is a front view of a mask plate, and FIG. 2 is a cross-sectional view of the mask plate 101 in FIG. 1 taken along the A-A' direction in FIG. 1. FIG. 2 is also a side view illustrating a thin film encapsulation structure formed by a masking process in which the thin film encapsulation structure includes a first barrier layer 203, an organic layer 204 and a second barrier layer 205 to encapsulate a to-be-encapsulated object 202. The reason for the occurrence of the shadow phenomenon in the process for forming films by the masking process will be explained below by taking the formation of the second harrier layer 205 as an example. A mask plate 101 is stretched by a frame 103 in figures. A plurality of openings 102 are provided on the entire mask plate, and the openings 102 correspond to targeted areas 206 for forming the second barrier layers 205. In an ideal case, a film layer can only be formed in an area corresponding to an opening 102, and conditions for forming a film are not met in an area covered by the mask plate 101 (for example, the electric field is shielded by the mask plate, and the reaction gas cannot be excited to plasma state), thus a film layer cannot be formed. However, in the actual case, since there is a gap between the mask plate 101 and the substrate for forming films (herein, the substrate 201), the reaction gas satisfying the condition for forming films may intrude into the gap between the mask plate 101 and the substrate 201 for a distance at a position close to the edge of the mask opening 102, resulting in forming a shadow film having a certain thickness in the gas. As the gas intrusion distance increases, the thickness of the shadow film becomes thinner and thinner and eventually becomes zero. Thus, the edge portion of the second barrier layer 205 formed by the mask plate has a tapered area 207 which is gradually thinned, which is the shadow phenomenon. As a result, the actual film forming area is larger than the targeted film forming area, and the tapered area 207 is located in a non-display area. In order to avoid generating cracks in the film during the process for cutting the substrate, the cutting path needs to be kept away from the thinned area. Therefore, the tapered area 207 causes an increase in the area of the non-display area, which is disadvantageous for achieving a narrow bezel.

At least one embodiment of the present disclosure provides a thin film encapsulation method which includes: providing a substrate, the substrate comprising at least one functional region, in which the functional region specifically refers to an area where a cutting path cannot pass through when the thin film encapsulation is completed and the substrate is cut, as this area includes all the structures that implement product functions, and a to-be-encapsulated object is provided in the functional region; forming a first barrier material layer, the first barrier material layer encapsulating the to-be-encapsulated object; forming an organic layer such that the orthographic projection of the organic layer on the substrate is within the functional region, the orthographic projection of the to-be-encapsulated object on the substrate is within the orthographic projection of the organic layer on the substrate; forming a second barrier material layer, the second barrier material layer encapsulating the organic layer; forming a masking material layer on the second barrier material layer such that an orthographic projection of the masking material layer on the substrate is within the functional region and is within the orthographic projection of the second barrier material layer on the substrate, the orthographic projection the organic layer on the substrate is within the orthographic projection of the masking material layer on the substrate, and the thickness of the masking material layer is smaller than a thickness of the second barrier material layer; performing an etching process on the second barrier material layer in which the masking material layer has a smaller etching rate than the second barrier material layer.

At least one embodiment of the present disclosure provides a thin film encapsulation structure which includes: a first barrier layer encapsulating a to-be-encapsulated object on a substrate; an organic layer on a side of the first barrier layer distal to the substrate, the orthographic projection of the to-be-encapsulated object on the substrate being within the orthographic projection of the organic layer on the substrate; a second barrier layer encapsulating the organic layer; and a masking layer on a side of the second barrier layer distal to the substrate, in which the orthographic projections of the second barrier layer, the first barrier layer and the masking layer on the substrate substantially overlap with each other, and the masking layer has a smaller thickness than the second barrier layer.

At least one embodiment of the present disclosure provides a display device which includes the thin film encapsulation structure formed by the thin film encapsulation method or the thin film encapsulation structure, in which the to-be-encapsulated structure or the encapsulated structure includes a light-emitting structure and a control circuit.

The method for encapsulating thin films, the thin film encapsulation structure, and the display device according to the present disclosure will be described below by several specific embodiments.

An embodiment provides a thin film encapsulation method for encapsulating a to-be-encapsulated object on a substrate, in which the to-be-encapsulated object generally includes a material sensitive to water and oxygen, and the to-be-encapsulated object may be an MED array made of an organic semiconductor material included in a display device or a lighting device, also may be a thin film solar cell made of an organic semiconductor material, or may be an array of photosensitive cells made of an organic semiconductor material used in an infrared detector and a camera. In the fabricating process of the above products, the substrate usually includes a plurality of repetitive functional regions, each of the functional regions corresponds to form a product.

There is a cutting zone between the functional regions, and the cutting path passes through the cutting zone when the substrate is cut. For example, for a display panel, each functional region includes a display substrate structure required for a display panel. In order to save cost and improve productivity, a plurality of functional regions on one substrate are usually processed simultaneously, for example, including formation films, photolithography, etching, cleaning, and the like, and all the functional regions on the entire substrate are encapsulated, then one substrate is divided into a plurality of display substrates by laser cutting or mechanical cutting, and a subsequent assembly process is performed to finally form a display panel.

The substrate in the present disclosure may include a plurality of functional regions. Of course, the substrate may also include only one functional region. In other words, the substrate may only produce one display panel.

Figure 3:
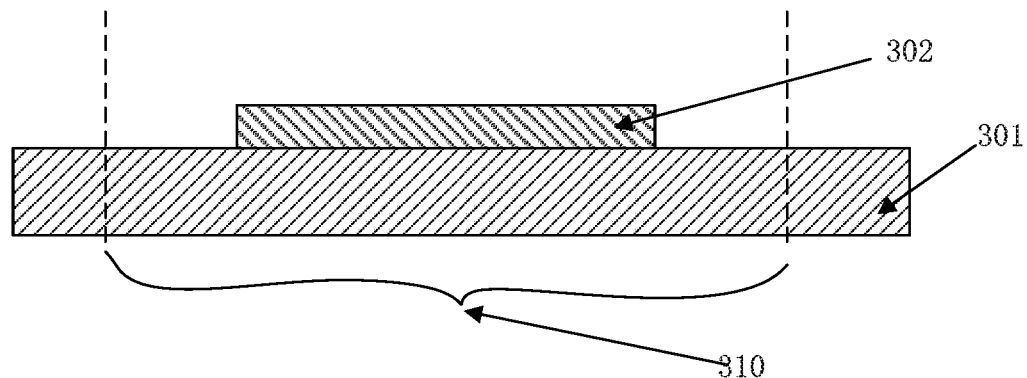
FIG. 3 is a schematic view illustrating a substrate and a to-be-encapsulated object before encapsulating.

As shown in FIG. 3, the to-be-encapsulated object 302 is formed in a functional region 310 of the substrate 301. The to-be-encapsulated object 302 may specifically include a thin film transistor, a wire and an OLEO, and film layers for separating each structure, for example, including passivation layer, planarization layer, interlayer dielectric layer, pixel defining layer, and the like.

Figure 4:
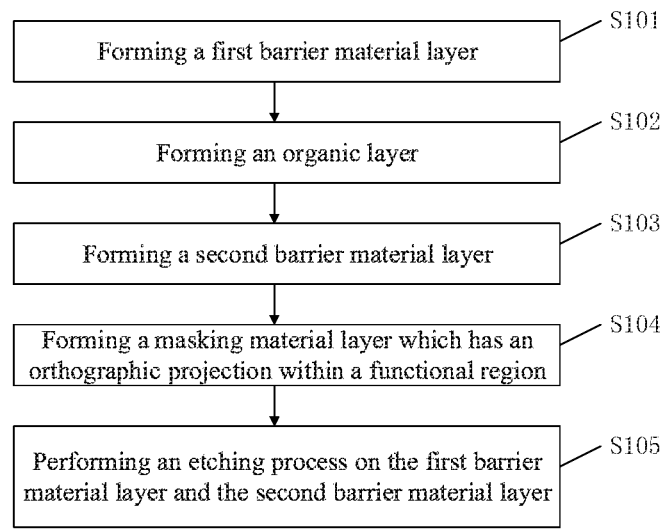
FIG. 4 is a flowchart illustrating a method for encapsulating thin films according to an embodiment of the present disclosure.

After the to-be-encapsulated object 302 is formed, the to-be-encapsulated object is encapsulated by the method for encapsulating thin films according to the present embodiment. For example, FIG. 4 is a flowchart illustrating a method for encapsulating thin films according to an example of the embodiment, and the method includes steps S101-S105.

Figure 5A:
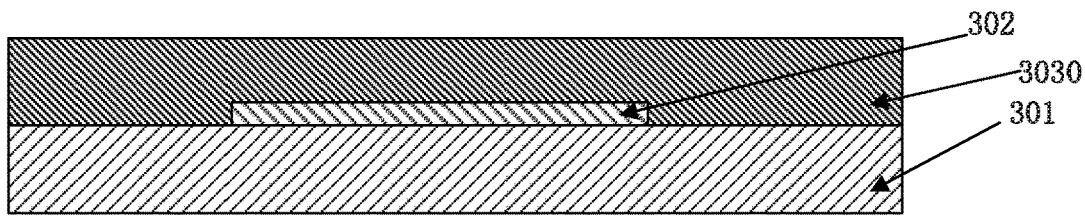
Figure 5B:
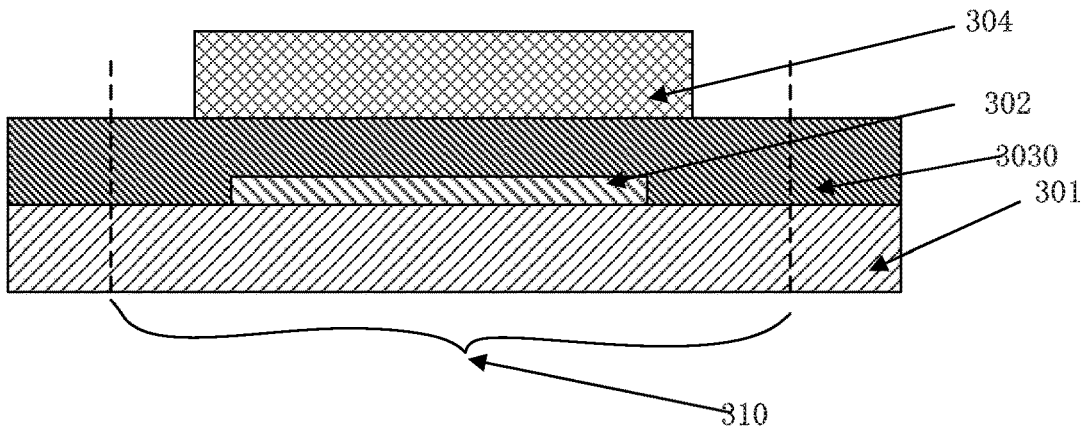

Step S101 includes:

As shown in FIG. 5A, a first barrier material layer 3030 is formed. The barrier material layer has a dense structure and has a good blocking effect on active molecules such as water molecules and oxygen molecules. In order to prevent the water vapor molecules and the oxygen molecules from contacting with the to-be-encapsulated object, the first barrier material layer 3030 is required to encapsulate, i.e. completely cover, the to-be-encapsulated object 302. In order to ensure the barrier property of the encapsulated film, the first barrier material layer 3030 cannot be too thin, and in order to ensure the encapsulated film have a certain degree of curvature and flexibility and also to reduce the overall thickness of the display device, the first barrier material layer 3030 cannot be too thick. Generally, the first barrier material layer is required to have a thickness between 0.1-1 μm.

The first barrier material layer 3030 may be formed by a plasma enhanced chemical vapor deposition (PECVD) process, that is, placing a substrate to be processed into a chamber for forming films, introducing a reaction gas, performing the plasma treatment on the reaction gas to increase the activity, then conducting chemical reaction between the reaction gases under specific reaction conditions, and the reaction product being deposited on the surface of the substrate to be processed, thus forming a first barrier material layer 3030 encapsulating the to-be-encapsulated object 302 on the substrate. The thickness of the first barrier material layer 3030 can be controlled by adjusting the reaction time.

Step S102 includes:

As shown in FIG. 513, an organic layer 304 is formed. The organic layer 304 functions in the following way. The barrier layer is easy to generate cracks during the use of the product due to its poor flexibility, and water or oxygen can penetrate into the to-be-encapsulated object 302 through these cracks, and thereby invalidating the encapsulation, thus, it is required to form an organic layer 304 on the surface of the first harrier material layer 3030, as the organic layer has good flexibility, and may evacuate and release the stress in the barrier material layer when the organic layer and the barrier material layer are attached to each other, thereby preventing the barrier material layer from cracking.

Figure 5C:
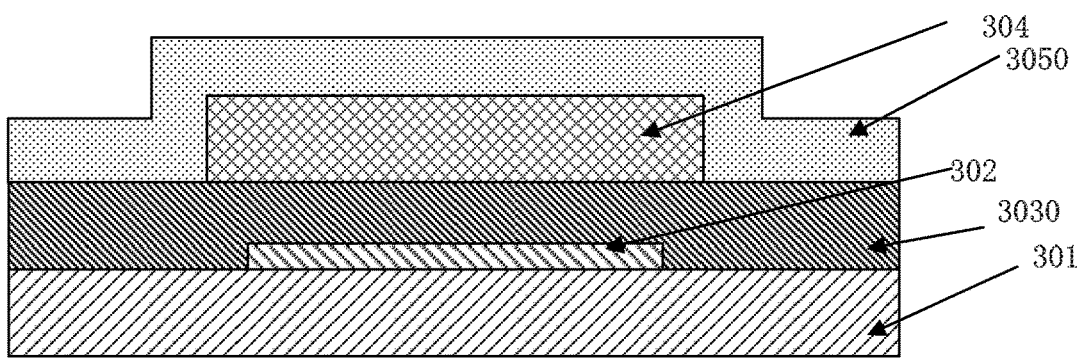

Step S103 includes:

As shown in FIG. 5C, a second barrier material layer 3050 is formed. Because the organic layer 304 has an affinity for water or oxygen, water or oxygen can diffuse along the organic layer and further penetrate into the to-be-encapsulated object 302 through cracks on the first barrier material layer 3030. Therefore, it is required to further provide a second barrier material layer 3050 on the organic layer 304, and the second harrier material layer 3050 completely covers the organic layer 304 to prevent the organic layer 304 from coming into contact with water or oxygen. The second barrier material layer 3005 can be formed by using the same process as the first barrier material layer 3030. The thickness of the second barrier material layer 3050 is preferably between 0.1-1 μm based on the same reason as stated above for the first barrier material layer 3050.

It should be noted that a film forming range of the organic layer 304 should also be limited as follows: 1) the organic layer 304 cannot exceed the orthographic projection of the functional region 310, otherwise, when the substrate is cut, the organic layer 304 extending between the adjacent functional regions will be exposed after dicing, resulting in coming into contact with water or oxygen; 2) the orthographic projection of the to-be-encapsulated object 302 on the substrate 301 should be within the orthographic projection of the organic layer 304 on the substrate 301, thus, there is a three-layered structure laminated with a barrier material layer-an organic layer-a barrier material layer on every part of the to-be-encapsulated object 302 to ensure efficient encapsulation for the whole to-be-encapsulated object 302.

Figure 5D:
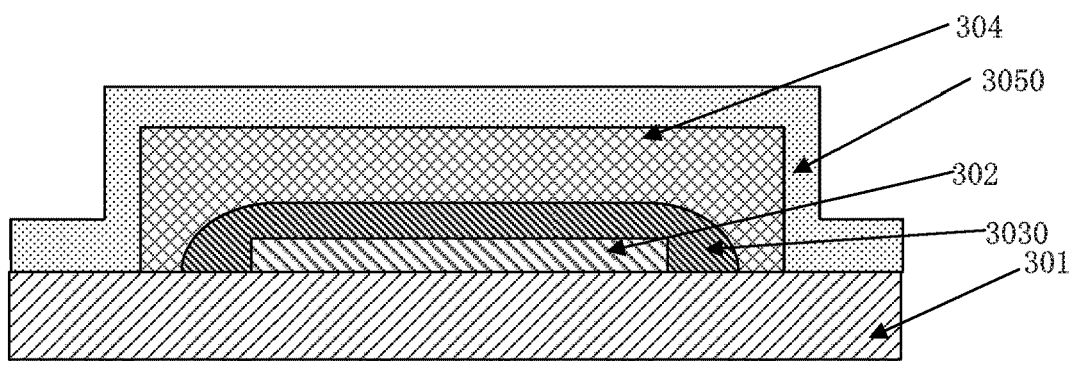

Optionally, the orthographic projection of the organic layer 304 on the substrate 301 is within the orthographic projection of the first barrier material layer 3030 on the substrate 301, that is, the first barrier material layer 3030 has a greater orthographic projection than the organic layer 304, as shown in FIG. 5C. If the organic layer exceeds the orthographic projection of the barrier material layer, a part of the organic layer (for example, a part of the organic layer 304) directly contacts the substrate 301, and the contact gap between the organic layer 304 and the substrate 301 is easily invaded by water or oxygen, as shown in FIG. 5D, which is not conducive to the blocking of water and oxygen. On the other hand, in the present disclosure, the organic layer limits the minimum accessible range of the finally formed display panel (because the cutting path cannot fall within the organic layer), or the minimum limit of the bezel width of the display panel, thus it is advantageous for minimizing the bezel to make the orthographic projection the organic layer smaller than that of the first barrier material layer 3030.

In order to limit the organic layer 304 in a specific range, the organic layer 304 may be formed by inkjet printing, vacuum evaporation, or screen printing. The region where the organic layer is formed is defined by adjusting the path of the nozzle in the inkjet printing, by using a mask plate in the vacuum evaporation method, or by using a screen plate in the screen printing. All of the three methods can obtain a specific pattern at the same time as the organic layer is formed, without the requirements of first forming an entire film layer, and then patterning by applying photo-resist, photo-etching and developing. Thus, process steps can be saved, and the damage to the to-be-encapsulated object caused by the chemical reagents involved in the photo-etching and developing process can be prevented.

Figure 5E:
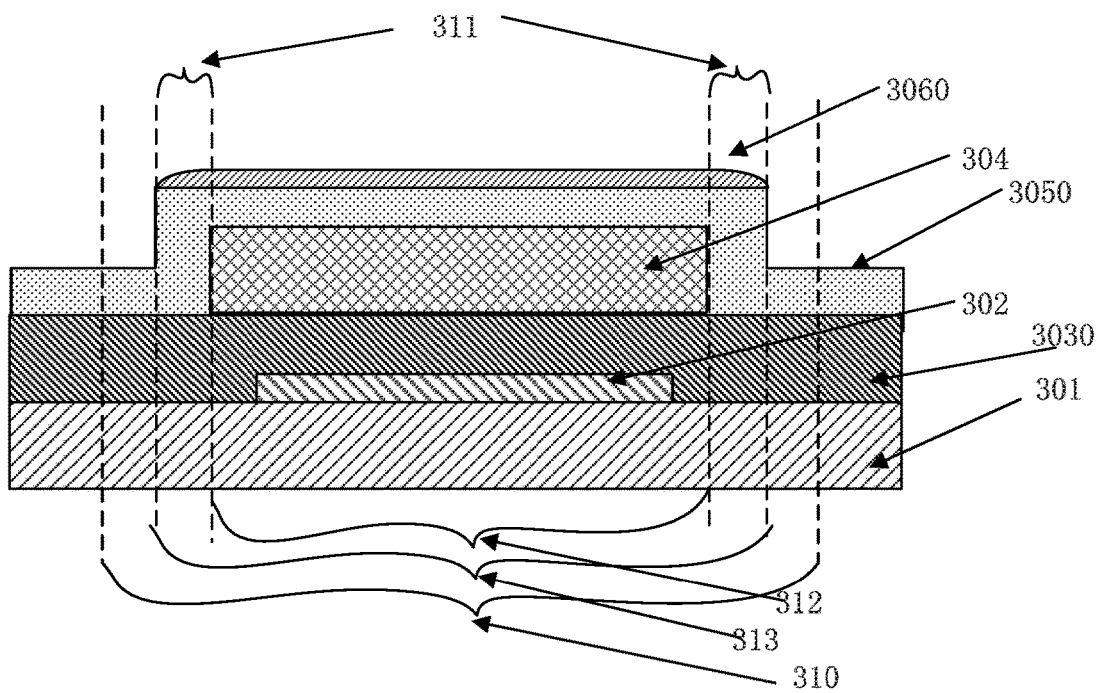

Step S104 includes:

As shown in FIG. 5E, a masking material layer 3060 is formed on the second barrier material layer such that an orthographic projection of the masking material layer on the substrate is within the functional region 310 and within the orthographic projection of the second barrier material layer 3050 on the substrate 301. The orthographic projection of the organic layer 304 on the substrate 301 is within the orthographic projection of the masking material layer 3060 on the substrate 301, and the masking material layer 3060 has a smaller thickness than the second barrier material layer 3050.

The mask material 3060 may be formed by an atomic layer deposition method (ALD).

Figure 5F:
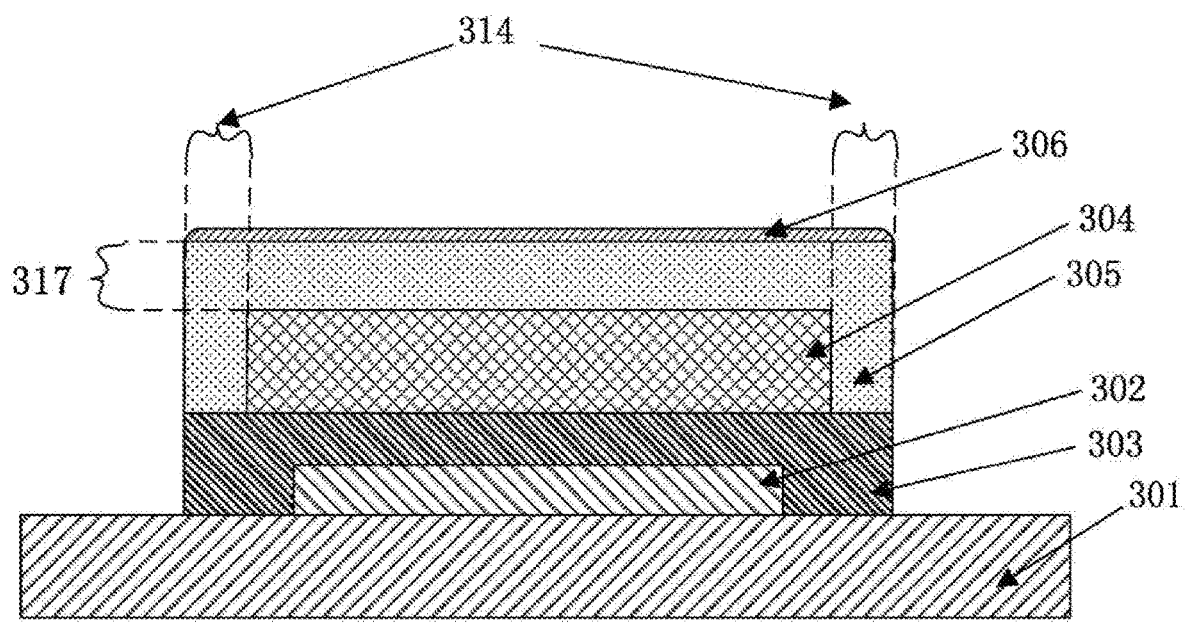

Step S105 includes:

When the orthographic projection of the organic layer 304 on the substrate 301 is within the orthographic projection of the first barrier material layer 3030 on the substrate 301, as shown in FIG. 5F, the first barrier material layer 3030 and the second barrier material layer 3050 are etched such that proportions of the first barrier material layer 3030 and second barrier material layer 3050 whose orthographic projections on the substrate fall outside the scope of the orthographic projection of masking material layer 3060 on substrate 301 are etched away. Thus, when the substrate is being cut, the cutting path can be closer to the to-be-encapsulated object 302, thereby reducing the area of the non-display area to make the bezel narrower. The masking material layer has a smaller etching rate than the first barrier material layer and the second barrier material layer respectively.

It can be seen that the masking material layer 3060 is utilized in the present disclosure as a mask for etching the first barrier material layer 3030 and the second barrier material layer 3050, thus, the masking material layer 3060 is required to have a smaller etching rate than the first barrier material 3030 and the second barrier material layer 3050. Generally, the masking material layer 3060 is formed by ALD, and has relatively dense structure which is not easily etched. The first barrier material layer 3030 and the second barrier material layer 3050 are formed by PECVD, and have a relatively loose structure which is more easily etched away by the etching solution. For example, the silicon oxide film fabricated by the PECVD method may have a more than four times greater etching rate than the silicon oxide film fabricated by the ALD method, and even more than ten times greater etching rate than the metal oxide film fabricated by the ALD method.

Figure 6:
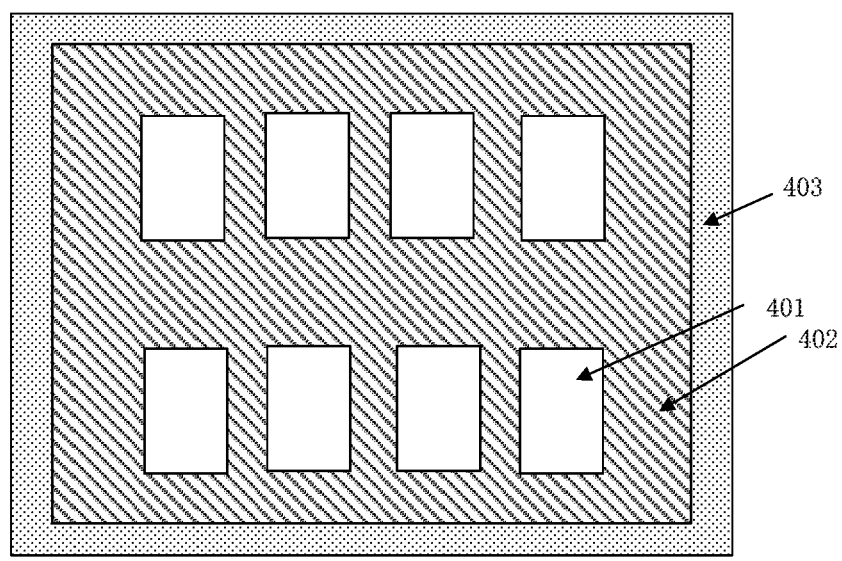
FIG. 6 is a top plan view of a mask plate for forming a masking layer according to an embodiment of the present disclosure.

In order to save the process steps, preferably, the masking material layer 3060 can be directly patterned by an ALD mask method. As shown in FIG. 6, the mask plate 402 is stretched by the frame 403, and openings 401 are provided in the mask plate. The openings 401 correspond to the targeted film forming area of the masking material layer 3060. Similarly, since there is a gap between the mask plate 402 and the substrate for forming the film (herein, the substrate denotes the second barrier material layer 3050), the reactive precursor may intrude from the edge position of the mask openings 401 into the gap between the mask plate 402 and the second barrier material layers 3050 for a distance to form a shadow film having a certain thickness in the gap. As the penetration distance of the precursor increases, the thickness of the shadow film becomes thinner and thinner and eventually becomes zero. Thus, there is also a tapered region at the edge of the pattern of the masking material layer 3060 formed by the masking plate. However, unlike the second barrier material layer 3050 formed by the masking method, the masking material layer 3060 here has a smaller thickness than the second barrier material layer 3050, and the tapered region of the masking material layer 3060 has a smaller length and a smaller thickness than the tapered region of the second barrier material layer 3050 respectively as the thickness and width of the tapered region are generally positively correlated with the thickness of the formed film, thus causing little impact on the width of the bezel.

In addition, it can be appreciated that although the masking material layer 3060 is etched at a very low rate, and still has a certain etching rate. Because the edge of the masking material layer is thinner, the tapered region may be etched away, and the masking material layer 3060 will be reduced after an etching process, further reducing the impact on the bezel.

The masking material layer 3060 is required to be larger than the organic layer 304, otherwise the organic layer 304 may be exposed when the first barrier material layer 3030 and the second barrier material layer 3050 are etched away, rendering the encapsulation ineffective. Obviously, the masking material layer should be within the second barrier material layer or the first barrier material layer, otherwise the masking material layer will not function to pattern the second barrier material layer 3050 and the first barrier material layer 3030.

By forming a patterned masking layer on the second barrier material layer, the masking material layer is of a mask for etching the second barrier layer to etch away the proportion of the second barrier material layer whose orthographic projection on the substrate is outside the orthographic projection of the masking material layer on the substrate. When the substrate is cut, the cutting path can be closer to the to-be-encapsulated object, thereby reducing the area of the non-display area to make the bezel narrower, solving the problem that a wide bezel is caused by a tapered zone due to the shadow phenomenon during the process for patterning the second barrier material layer by the conventional method, and favorably achieving the display device with a narrow bezel.

Figure 5G:
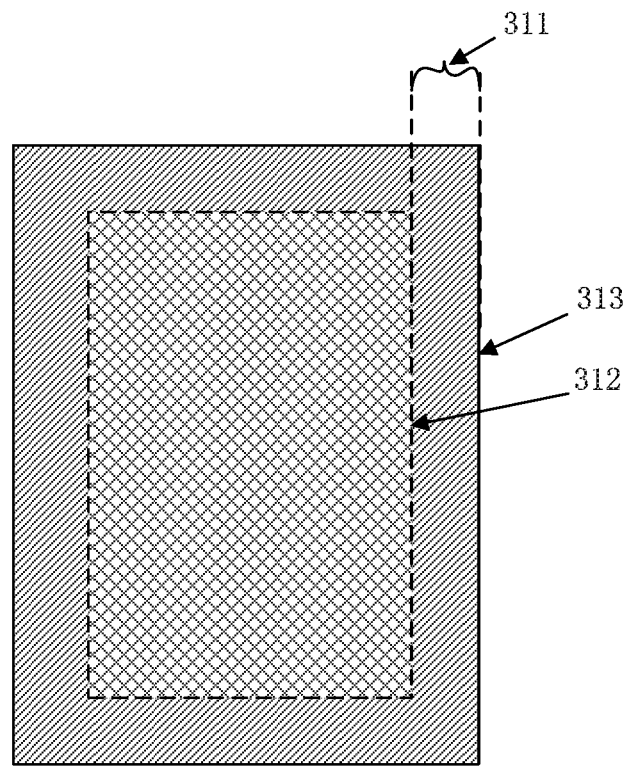

As shown in FIGS. 5E-5G, the orthographic projection 313 of the masking material layer 3060 on the substrate 301 outside the orthographic projection 312 of the organic layer 304 on the substrate 301 is an annular region. Optionally, the width 311 of the annular region is set to be not smaller than the thickness of the second barrier material layer 3050, so that after the second barrier material layer 3050 is etched, the sidewall thickness 314 of the second barrier layer 305 which is attached to the side surface of the organic layer 304 is not smaller than the thickness 317 of the second barrier material layer 3050 to ensure the barrier to water and oxygen and prevent water and oxygen from invading the organic layer from a side surface.

The masking material layer 3060 should have a smaller thickness than the second barrier material layer for the reason that the excessively thick masking layer may increase the film forming time and reduce the yield, apart from reducing the influence of the tapered zone generated when the ALD process is employed by a masking method on the bezel.

In order to ensure that the proportions of the second barrier material layer 3050 and the first barrier material layer 3030 outside the orthographic projection of the masking material layer 3060 on the substrate 301 are etched away and the proportion of the masking material layer 3060 outside the tapered region is not completely etching away for the purpose of avoiding exposing the protected second barrier material layer 3050, the masking material layer 3060 should be provided with at least a certain thickness. The minimum thickness should be determined based on the ratio of the etching rate of the first barrier material layer 3030 or the second barrier material layer 3050 to the etching rate of the masking material layer 3060. Optionally, when the first barrier material layer 3030 or the second barrier material layer 3050 has a more than eight times greater etching rate than the masking material layer 3060, it is sufficient that the masking material layer 3060 has a thickness not smaller than one-eighth of the sum of the thicknesses of the first barrier material layer 3030 and the second barrier material layer 3050. If the ratio of the etching rate of the first barrier material layer 3030 or the second barrier material layer 3050 to the etching rate of the masking material layer 3060 is further reduced, it is required to increase the thickness of the masking material layer 3060, which will increase the film forming time and reduce the yield as mentioned above. Further optionally, if the first barrier material layer 3030 or the second barrier material layer 3050 has a much larger etching rate than the masking material layer 3060, or, if the masking material layer 3060 does not substantially react with the etching medium, the masking material layer 3060 can be disposed to have a much smaller thickness than the barrier material layer, thereby saving the film forming time, increasing the yield, and reducing the tapered zone of the masking material layer to favorably achieve a narrow bezel.

After completing etching on the first barrier material layer 3030 and the second barrier material layer 3050, the masking material layer 3060 has a remaining thickness of no greater than 100 nm, as the excessively thick masking material layer has a reduced bendability and is easy to generate cracks during the bending of the to-be-encapsulated object.

It should be noted that the remaining masking material layer 3060 after the etching process can also improve the barrier effect of the thin film encapsulation structure, and further prevent water or oxygen from intruding into the to-be-encapsulated object 302.

During the process for performing etching on the first barrier material layer 3030 and the second barrier material layer 3050, since there are etching rates in all directions, it is likely to over-etch the second barrier material layer 3050 under the edge of the masking material layer 3060, resulting in the masking material layer suspending and falling off or exposing the organic layer 304. In order to prevent this problem from occurring, an anisotropic etching method, such as an inductively coupled plasma (ICP) process, may be employed. The etching rate of the etching medium in the thickness direction of the second barrier material layer 3030 is much greater than the etching rate in the direction parallel to the second barrier material layer 3050 by adjusting a suitable electric field and gas pressure.

It should be noted that since the first barrier layer 303 and the second barrier layer 305 are patterned by means of the masking material layer, any pattern may not be performed when forming the first barrier material layer 3030 and the second barrier material layer 3050. That is, the first barrier material layer 3030 or the second barrier material layer 3050 is arranged to cover the entire substrate. Strictly speaking, the edge proportion of the substrate may have an uncovered region due to process limitations. The first barrier material layer 3030 and the second barrier material layer 3050 are arranged to cover the entire functional regions 310 and the dicing areas between the functional regions 310 on the entire substrate without excluding some edge of the substrate uncovered by the first barrier material layer 3030 and the second barrier material layer 3050.

Figure 7:
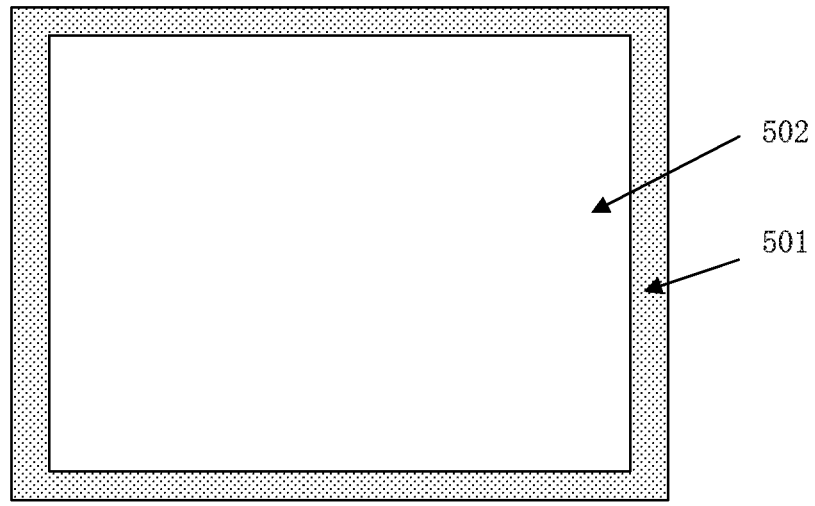
FIG. 7 is a top plan view of a mask plate for forming a first barrier layer or a second barrier layer according to an embodiment of the present disclosure.

In some embodiments, as shown in FIG. 7, the first barrier material layer 3030 and/or the second barrier material layer 3050 may be formed by an open masking method. For example, in the process of the PECVD, the opening 502 in the mask frame 501 exposes the entire substrate without the requirements of providing openings corresponding to each functional region, which can reduce the technology difficulty in fabricating a mask plate.

Figure 8:
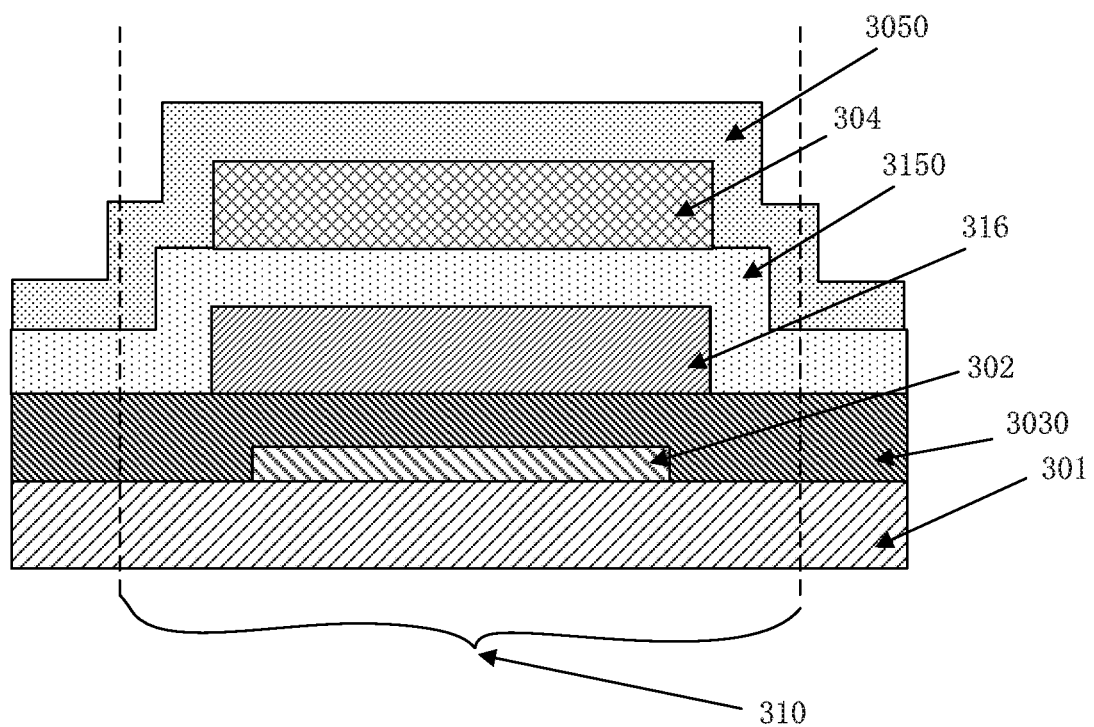
FIG. 8 is a schematic diagram illustrating the structure before an etching process in a flow of a method for encapsulating thin films according to an embodiment of the present disclosure.

It should be noted that the thin film encapsulation structure is not limited to the three-layered structure of the barrier material layer-organic layer-barrier material layer. As shown in FIG. 8, it may also have five-layered structure of a barrier material layer-organic layer-barrier material layer-organic layer-barrier material, or even more layers, to enhance the encapsulating effect. In other words, a step of forming the organic layer 316 and the barrier material layer 3150 alternately in pairs may be further included between the step S101 of forming the first barrier material layer 3030 and the step S102 of forming the organic layer 304, so that the organic layer is encapsulated by the barrier layer provided in pair with the organic layer. The method by which the organic layer and the barrier material layer are formed is as described above, and will not be described herein.

It should be noted that, in step S105, when the orthographic projection of the organic layer on the substrate exceeds the orthographic projection of the first barrier material layer on the substrate, as shown in FIG. 5D, that is, when the organic layer encapsulates the first barrier material layer, only the second barrier material layer is required to be etched. Accordingly, the masking material layer is merely required to have a smaller etching rate than the second barrier material layer.

In the case where more than one organic layer and more than two barrier material layers are alternately arranged and an organic layer encapsulates the barrier material layer on the side of the organic layer proximal to the to-be-encapsulated object, the barrier material and each of barrier material layers on the side of the barrier material layer proximal to the to-be-encapsulated object are not required to be etched, and accordingly, the masking material layer is not required to have a smaller etching rate than the barrier material layers. And when the orthographic projections of all the organic layers on the substrate are within the orthographic projection of the first barrier material layer on the substrate, as shown in FIG. 8, the foregoing etching step further includes steps of performing etching on each of the barrier material layers other than the first barrier material layer and the second barrier material layer such that the proportion of the barrier material layer whose orthographic projection on the substrate falls outside the orthographic projection of the masking material layer 3060 on the substrate 301 is etched away. Thus, when the substrate is being cut, the cutting path can be closer to the to-be-encapsulated object 302, thereby reducing the area of the non-display area to make the bezel narrower.

Finally, it is required to arrange the orthographic projection of each organic layer on the substrate within the orthographic projection of the masking material layer on the substrate, so that the organic layer is not exposed after the barrier material layers are etched respectively, thereby preventing the damage of the encapsulating effect.

Figure 9A:
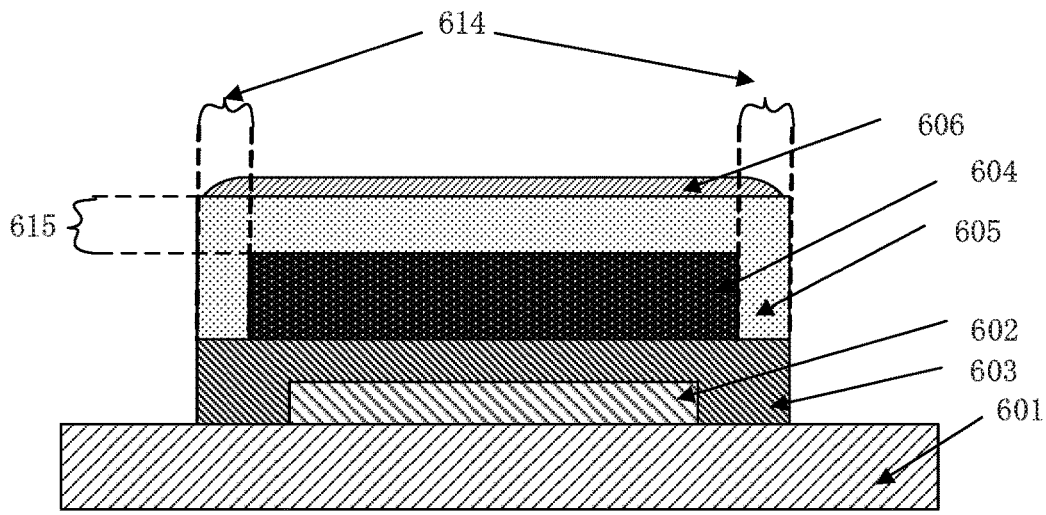
FIG. 9A-9C are schematic diagrams illustrating several obtainable thin film encapsulation structures according to an embodiment of the present disclosure.

The following embodiment provides a thin film encapsulation structure for encapsulating a to-be-encapsulated object on a substrate. For example, as shown in FIG. 9A, the thin film encapsulation structure specifically includes: a first barrier layer 603 encapsulating the to-be-encapsulated object 602 on a substrate 601; and an organic layer 604 on a side of the first barrier layer 603 distal to the substrate, the orthographic projection of the to-be-encapsulated object 602 on the substrate 601 being within the orthographic projection of the organic layer on the substrate; a second barrier layer 605 encapsulating the organic layer 604; and a masking layer 606 on the side of the second barrier layer 605 distal to the substrate 601, the orthographic projection of the masking layer 606 on the substrate 601 surrounds the orthographic projections of the second barrier layer 605, the first barrier layer 603 and the organic layer 604 on the substrate 601 respectively, and the masking layer 606 has a smaller thickness than the second barrier layer 605.

The first barrier layer 603 completely covers the to-be-encapsulated object 602. The barrier layer structure has a dense structure, and has a good Hocking effect on active molecules such as water vapor molecules and oxygen molecules. In order to prevent moisture molecules and oxygen molecules from contacting the to-be-encapsulated object 602, the to-be-encapsulated object 602 is required to be encapsulated by the first barrier layer 603, i.e., completely covered. In order to ensure the barrier effect of the encapsulated film, the first barrier layer 603 cannot be too thin. At the same time, in order to ensure the encapsulated film has a certain degree of curvature and flexibility, and also to reduce the overall thickness of the display device, the first barrier layer 603 cannot be too thick. Optionally, the thickness of the first barrier layer is set to be in the range of 0.1-1 μm.

Since the barrier layer is less flexible, cracks easily occur during the use of the product, and water or oxygen can penetrate into the to-be-encapsulated object 602 through these cracks, thereby invalidating the encapsulation. Thus, it is required to provide an organic layer 604 on the side of the first barrier layer 603 distal to the substrate 601. The organic layer has good flexibility, and can evacuate and release the stress in the barrier layer when the organic layer and the barrier layer are attached to each other, thereby preventing the barrier layer from cracking.

Because the organic layer has an affinity for water and oxygen, water and oxygen may diffuse along the organic layer 604 and further invade the encapsulated structure 602 through cracks on the barrier layer, thus, it is required to dispose a second barrier layer 605 to completely cover the organic layer 604 to prevent it from being contacted by water and oxygen. Based on the same reason as stated above for the first barrier layer 603, optionally, the thickness of the second barrier layer 605 is set to be in the range of 0.1-1 μm.

The orthographic projection of the to-be-encapsulated object on the substrate is within the orthographic projection of the organic layer on the substrate, such that a laminated structure of barrier layer-organic layer-barrier layer stack structure exists everywhere over the to-be-encapsulated object 602 to ensure effective encapsulation of every part of the to-be-encapsulated object 602.

Figure 9B:
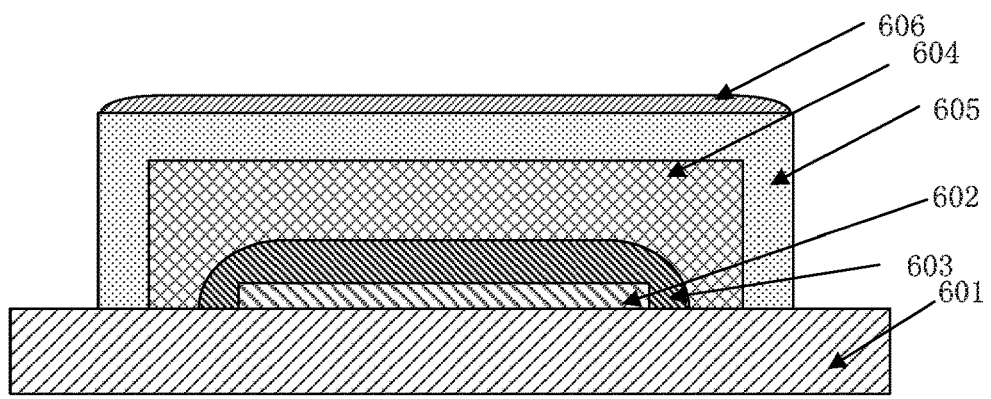

Optionally, as shown in FIG. 9A, the orthographic projection of the organic layer on the substrate 601 is within the orthographic projection of the first barrier layer 603 on the substrate 601, that is, the first barrier layer 603 is greater than the organic layer 604. If the organic layer exceeds the barrier layer, a proportion of the organic layer (for example, a proportion of the organic layer 604) directly contacts with the substrate 601, and the contact gap between the organic layer and the substrate is easily invaded by water or oxygen, as shown in FIG. 9B, thus affecting the encapsulation effect. On the other hand, in the present disclosure, the organic layer limits the minimum accessible range of the finally formed display panel (because the cutting path cannot be in the organic layer), or the minimum limit of the bezel width of the display panel, thus the organic layer rang is disposed to be smaller than the first barrier layer 603 is advantageous for minimizing the bezel.

The masking layer 606 on the side of the second barrier layer 605 distal to the substrate 601 serves as a mask for patterning the first barrier layer 603 and the second barrier layer 605 in the process for fabricating the thin film encapsulation structure. The proportions of the first barrier layer 603 and the second barrier layer 605 that are not covered by the masking layer 606 will be etched away, and therefore, each of the orthographic projections of the second barrier layer 605 and the first barrier layer 603 on the substrate 601 is within the orthographic projection of the masking layer 606 on substrate 601.

When the first barrier layer 603 and the second barrier layer 605 are etched by an etching method having desired anisotropy, that is, when the etching medium has an etching rate of zero in a plane parallel to the second barrier layer 605, the first barrier layer 603 and the second barrier layer 605 under the masking layer 606 are not over-etched, so that the orthographic projections of the first barrier layer 603, the second barrier layer 605 and the masking layer 606 on the substrate 601 overlap with each other, which will ensure that the organic layer is not exposed due to over-etching, thereby improving the reliability of the thin film encapsulation.

The masking layer 606 should have a smaller thickness than the second barrier layer 605 for the following reasons: firstly, the masking layer 606 formed by the mask method is affected by the shadow phenomenon, and has an edge with a tapered region, thereby increasing the width of the bezel, so when the masking layer 606 is too thick, the width of the tapered region increases, which is disadvantageous for achieving narrow bezel; secondly, the excessively thick masking layer increases the film forming time and reduces the yield; thirdly, the excessively thick masking layer can have a reduced bendability, and is easy to generate cracks in the process of the bending of the to-be-encapsulated object. Optionally, the thickness of the masking layer 606 does not exceed 100 nm.

As shown in FIG. 9A, optionally, the sidewall thickness 614 of the second barrier layer 605 attached to the side surface of the organic layer 604 is not smaller than the thickness 615 of the proportion of the second barrier layer 605 between the masking layer 606 and the organic layer 605 to ensure the barrier to water and oxygen and to prevent water and oxygen from invading into the organic layer from the side surface.

Optionally, in the thin film encapsulation structure, a material of the masking layer 606 includes at least one of aluminum oxide, zinc oxide, indium oxide, tin oxide, gallium oxide, hafnium oxide, and zirconium oxide. A material of the first barrier layer 603 includes at least one of silicon nitride, silicon oxide, and silicon oxynitride, and/or a material of the second barrier layer 605 includes at least one of silicon nitride, silicon oxide, and silicon oxynitride. A material such as aluminum oxide, zinc oxide, indium oxide, tin oxide, gallium oxide, hafnium oxide, and zirconium oxide is generally more difficult to be etched away than a material such as silicon nitride, silicon oxide, and silicon oxynitride.

Optionally, in the thin film encapsulation structure, a material of the organic layer 604 is an organic material like epoxy resin. The material has good flexibility and light transmittance, and serves to buffer stress and prevents the first barrier layer 603 or the second barrier layer 605 from cracking. At the same time, good light transmittance allows the thin film encapsulation structure to be employed in devices such as solar cells and display panels, etc.

Optionally, the masking layer 606 has a thickness of no greater than 100 nm, as the excessively thick masking layer has a reduced bendability, and is easy to generate cracks in the process of the bending of the thin film encapsulation structure.

It should be noted that the thin film encapsulation structure is not limited to the three-layered structure of the barrier layer-organic layer-barrier layer, as shown in 9C, but may also be a five-layered structure of the barrier layer-organic layer-barrier layer-organic layer-barrier layer, and even more layers to enhance the encapsulation effect. In other words, an organic layer and a barrier layer formed alternately in pairs may be included between the first barrier layer 603 and the organic layer 604, and the organic layer is encapsulated by the harrier layer disposed in pair with it to ensure the organic layer will not be exposed and not be eroded by water and oxygen.

It should be noted that when the orthographic projection of the organic layer 604 on the substrate exceeds the orthographic projection of the first barrier layer 603 on the substrate 601, as shown in FIG. 9B, that is, when the organic layer encapsulates the first barrier layer, only the second barrier layer is required to be etched, so the masking layer is only used to pattern the second barrier layer. Since the first barrier layer is encapsulated by the organic layer and the organic layer is encapsulated by the second barrier layer, the orthographic projection of the first harrier layer on the substrate is naturally within the orthographic projection of the masking layer on the substrate.

Figure 9C:
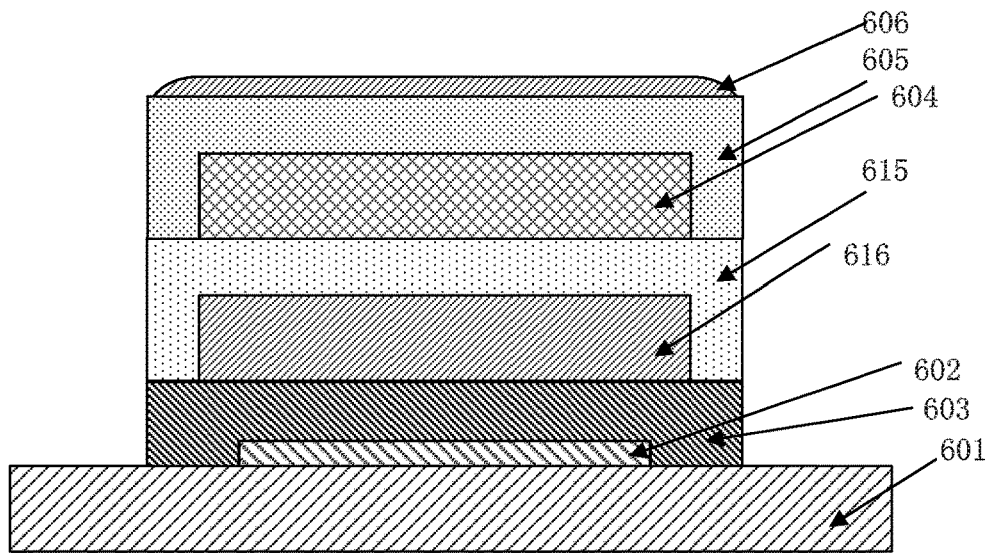

In the case where more than one organic layer and more than two barrier layers are alternately laminated, and an organic layer encapsulates the adjacent barrier layer on the side of the organic layer proximal to the to-be-encapsulated object, the barrier layer and each of barrier layers on one side of the barrier layer proximal to the to-be-encapsulated object are not required to be etched away. Since each of barrier layers on the side of the organic layer distal to the to-be-encapsulated object is patterned by the masking layer, each of the orthographic projections of the barrier layers on the side of the organic layer distal to the to-be-encapsulated object on the substrate is naturally within the orthographic projection of the masking layer on the substrate. Since the organic layer encapsulates the adjacent barrier layer on the side of the organic layer proximal to the to-be-encapsulated object, each of the orthographic projections of the barrier layer and all the barrier layers on the side of the harrier layer proximal to the to-be-encapsulated object on the substrate is naturally within the orthographic projection of the masking layer on the substrate. And when each of the orthographic projections of all the organic layers on the substrate is within the orthographic projection of the first barrier layer on the substrate, as shown in FIG. 9C, the masking layer is also used to pattern each of the barrier layers other than the first barrier layer and the second barrier layer such that the proportion of the barrier layer whose orthographic projection on the substrate is outside the orthographic projection of the masking layer on the substrate is etched away. Thus, the orthographic projection of each of the barrier layers other than the first barrier layer and the second barrier layer on the substrate 601 is also within the of the orthographic projection of the masking layer 606 on the substrate 601, and when the substrate is being cut, the cutting path can be closer to the to-be-encapsulated object 602, thereby reducing the area of the non-display area and make the bezel narrower.

The following embodiment provides a display device, including a substrate, a light emitting structure, a control circuit, and the thin film encapsulation structure or a thin film encapsulation structure formed by the method for encapsulating thin films. The light emitting structure may be an OLED or a quantum dot light emitting diode. The control circuit can be made of an organic material or an inorganic material. The thin film encapsulation structure or the thin film encapsulation structure formed by the method for encapsulating thin films can prevent the material of the light emitting structure or the control circuit from changing the properties in a water and oxygen environment, thereby degrading the yield and life of the display device. The thin film encapsulation structure or the structure formed by the method for encapsulating thin films solves the problem that the tapered zone at the edge of the thin film encapsulation structure is too wide and the bezel is caused to be too wide due to the shadow phenomenon.

The display device may specifically be any product or component having a display function, such as a liquid crystal panel, an electronic paper, an OLED panel, a mobile phone, a tablet computer, a television, a display, a notebook computer, a digital photo frame, a navigator, etc., which will not be limited in this embodiment.

There are also the following points to be noted:

(1) The accompanying drawings of the embodiments of the present disclosure relate only to the structures involved in the embodiments of the present disclosure, and other structures can refer to general designs.

(2) For the sake of clarity, in the accompanying drawings for describing embodiments of the present disclosure, the thickness of layers or regions is enlarged or reduced, that is, the drawings are not drawn according to actual scales. It will be understood that when an element such as a layer, a film, a region or a substrate is referred to as "on/above" or "below/under", the element may be arranged "on/above" or "below/under" the other element directly or there may be an intermediate element.

(3) In the case of no conflict, the embodiments of the present disclosure and the features in the embodiments may be combined with each other to obtain a new embodiment.

The above is only the specific embodiment of the present disclosure, but the scope of the present disclosure is not limited thereto, and any changes or substitutions made easily within the technical scope of the disclosure by one skilled in the art should fall within the scope of the present disclosure. Thus, the scope of the disclosure should be determined by the scope of the claims.

What is claimed is:

1. A thin film encapsulation method comprising:
   providing a substrate, the substrate comprising at least one functional region provided with a to-be-encapsulated object;
   forming a first barrier material layer encapsulating the to-be-encapsulated object;
   forming an organic layer such that an orthographic projection of the organic layer on the substrate is within the functional region, and an orthographic projection of the to-be-encapsulated object on the substrate is within the orthographic projection of the organic layer on the substrate;
   forming a second barrier material layer encapsulating the organic layer;
   forming a masking material layer on a proportion of the second barrier material layer such that an orthographic projection of the masking material layer on the substrate is within the functional region and within an orthographic projection of the second barrier material layer on the substrate, the orthographic projection of the organic layer on the substrate is within the orthographic projection of the masking material layer on the substrate, and the masking material layer has a smaller thickness than the second barrier material layer; and performing an etching process on the second barrier material layer by using the masking material layer as a mask, such that the masking material layer is etched simultaneously, and a second barrier layer and a masking layer are formed, wherein the masking material layer has a smaller etching rate than the second barrier material layer.

2. The thin film encapsulation method according to claim 1, wherein the step of forming an organic layer such that an orthographic projection of the organic layer on the substrate is within the functional region comprises forming the organic layer such that the orthographic projection of the organic layer on the substrate is within an orthographic projection of the first barrier material layer on the substrate; and the thin film encapsulation method further comprises performing an etching process on the first barrier material layer, wherein the masking material layer has a smaller etching rate than the first barrier material layer.

3. The thin film encapsulation method according to claim 1, wherein the step of forming an organic layer such that an orthographic projection of the organic layer on the substrate is within the functional region comprises forming the organic layer such that an orthographic projection of the first barrier material layer on the substrate is within the orthographic projection of the organic layer on the substrate.

4. The thin film encapsulation method according to claim 2, wherein the first barrier material layer or the second barrier material layer has an eight times greater etching rate than the masking material layer, and the masking material layer has a thickness of no smaller than one eighth of a sum of the thicknesses of the first barrier material layer and the second barrier material layer.

5. The thin film encapsulation method according to claim 4, wherein after completing the etching on the first barrier material layer, the second barrier material layer and the masking material layer, a masking layer has a remaining thickness of no greater than 100 nm.

6. The thin film encapsulation method according to claim 5, wherein the step of forming a masking material layer on a proportion of the second barrier material layer such that an orthographic projection of the masking material layer on the substrate is within the functional region comprises forming the masking material layer, wherein the orthographic projection of the masking material layer on the substrate outside the orthographic projection of the organic layer on the substrate is an annular region, and a width of the annular region is greater than the thickness of the second barrier material layer.

7. The thin film encapsulation method according to claim 6, wherein the step of forming a masking material layer on a proportion of the second barrier material layer such that an orthographic projection of the masking material layer on the substrate is within the functional region comprises forming the masking material layer by atomic layer deposition with a mask plate.

8. The thin film encapsulation method according to claim 7, wherein a process of plasma enhanced chemical vapor deposition is employed in the process of forming the first barrier material layer and the second barrier material layer, and the first barrier material layer or the second barrier material layer has a thickness of about 0.1 to 1 μm.

9. The thin film encapsulation method according to claim 8, wherein an inductively coupled plasma process is employed in the process of performing an etching process on the first barrier material layer and the second barrier material layer.

10. The thin film encapsulation method according to claim 8, wherein an opening of the mask plate in a mask plate frame is disposed to expose the entire substrate in the process of plasma enhanced chemical vapor deposition when forming the first barrier material layer and/or the second barrier material layer.

* * * * *